(12) United States Patent
Ishikawa

(10) Patent No.: US 9,587,769 B2
(45) Date of Patent: Mar. 7, 2017

(54) CONNECTING STRUCTURE FOR REFRIGERANT PIPE AND INVERTER INCLUDING CONNECTING STRUCTURE

(71) Applicant: Toyota Jidosha Kabushiki Kaisha, Toyota-shi, Aichi-ken (JP)

(72) Inventor: Keitaro Ishikawa, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 290 days.

(21) Appl. No.: 14/558,034

(22) Filed: Dec. 2, 2014

(65) Prior Publication Data

US 2015/0152987 A1 Jun. 4, 2015

(30) Foreign Application Priority Data

Dec. 4, 2013 (JP) .................................. 2013-250826

(51) Int. Cl.
| | |
|---|---|
| *F16L 5/12* | (2006.01) |
| *F16L 41/08* | (2006.01) |
| *F25B 41/00* | (2006.01) |
| *B60H 1/00* | (2006.01) |

(52) U.S. Cl.
CPC ............ *F16L 5/12* (2013.01); *B60H 1/00271* (2013.01); *B60H 1/00571* (2013.01); *F16L 41/086* (2013.01); *F25B 41/003* (2013.01)

(58) Field of Classification Search
CPC ...... F16L 5/12; F16L 41/086; B60H 1/00571; B60H 1/00271; F25B 41/003

USPC ............... 285/350, 363, 405; 361/688, 699; 363/141

See application file for complete search history.

(56) References Cited

U.S. PATENT DOCUMENTS

| | | | | |
|---|---|---|---|---|
| 2008/0198548 | A1* | 8/2008 | Nakamura | H05K 7/20927 361/689 |
| 2008/0264621 | A1* | 10/2008 | Yoshino | B23P 15/26 165/178 |
| 2009/0145152 | A1* | 6/2009 | Yoshino | F25B 41/003 62/259.1 |
| 2009/0146415 | A1* | 6/2009 | Abei | F16L 39/00 285/30 |
| 2009/0261584 | A1* | 10/2009 | Tsai | F16L 25/0045 285/405 |

(Continued)

FOREIGN PATENT DOCUMENTS

| | | |
|---|---|---|
| JP | 2012-054444 A | 3/2012 |
| JP | 2012-064724 A | 3/2012 |

(Continued)

*Primary Examiner* — Anthony Haughton
*Assistant Examiner* — Yahya Ahmad
(74) *Attorney, Agent, or Firm* — Dinsmore & Shohl LLP

(57) ABSTRACT

A connecting structure includes a housing, a cooler, an inner refrigerant pipe, an outer refrigerant pipe, and a joint pipe. The joint pipe is attached to a through hole of the housing. The inner refrigerant pipe is fitted to the joint pipe from a housing inner side. The outer refrigerant pipe is fitted to the joint pipe from a housing outer side. A tip of the inner refrigerant pipe and a tip of the outer refrigerant pipe define a gap inside the joint pipe. An end surface of a flange or a rib of the outer refrigerant pipe in a refrigerant-pipe axis direction abuts with an end surface of a flange or a rib of the joint pipe in the refrigerant-pipe axis direction.

7 Claims, 6 Drawing Sheets

(56) References Cited

U.S. PATENT DOCUMENTS

2014/0140118 A1* 5/2014 Ishikawa ............ H05K 7/20927
           363/141
2015/0189790 A1* 7/2015 Tachibana .......... H05K 7/20927
           361/699

FOREIGN PATENT DOCUMENTS

| JP | 2012-210022 A | 10/2012 |
| JP | 2014-102017 A | 6/2014 |

* cited by examiner

CONNECTING STRUCTURE FOR REFRIGERANT PIPE AND INVERTER INCLUDING CONNECTING STRUCTURE

INCORPORATION BY REFERENCE

The disclosure of Japanese Patent Application No. 2013-250826 filed on Dec. 4, 2013 including the specification, drawings and abstract is incorporated herein by reference in its entirety.

BACKGROUND OF THE INVENTION

1. Field of the Invention

The present invention relates to a connecting structure for connecting an inner refrigerant pipe extending from a cooler inside a housing for an in-vehicle device, to an outer refrigerant pipe placed outside the housing at a housing wall. Typically, the present invention relates to a connecting structure in an inverter including a cooler in a housing, and the connecting structure connects an outer refrigerant pipe to an inner refrigerant pipe extending from the cooler.

2. Description of Related Art

In an electronic device including a liquid cooling cooler, it is necessary to connect an outer refrigerant pipe to a refrigerant pipe of the cooler. A connecting part therebetween is often placed on a housing wall. This is because a structure for connecting them can be fixed to the housing wall.

The refrigerant pipes are not just connected, but various efforts are made for an in-vehicle device, e.g., an inverter of an electric vehicle. For example, Japanese Patent Application Publication No. 2012-064724 (JP 2012-064724 A) proposes a structure in which, even if refrigerant leaks at a connection portion, the refrigerant is hard to come inside a housing. In the technique, a joint is fitted to a through hole of the housing. The joint has a hollow when viewed from outside the housing, and a refrigerant pipe of a cooler projects from a bottom of the hollow. A refrigerant pipe of the cooler is connected to an outer refrigerant pipe inside the hollow. Since the inside of the hollow corresponds the outside of the housing, even if it refrigerant leaks at the time of disconnection between the refrigerant pipe of the cooler and the outer refrigerant pipe, the refrigerant is prevented from coming inside the housing. In the following description, the refrigerant pipe inside the in-vehicle device is referred to as an inner refrigerant pipe, and the refrigerant pipe outside the housing is referred to an outer refrigerant pipe.

SUMMARY OF THE INVENTION

One of factors that should be considered in terms of the in-vehicle device is measures for collision. In a case of an in-vehicle device in which an outer refrigerant pipe and an inner refrigerant pipe are connected at a housing wall, when the outer refrigerant pipe is pushed deep inside the housing due to an impact of a collision, the outer refrigerant pipe pushes the inner refrigerant pipe and the cooler to which the inner refrigerant pipe is connected is damaged eventually, which may cause liquid refrigerant to leak out inside the housing. The present specification relates to a connecting structure for connecting an outer refrigerant pipe and an inner refrigerant pipe at a housing wall of an in-vehicle device, and provides a structure in which a cooler inside a housing is hard to be damaged at the time of a collision.

Further, the present specification provides a new in-vehicle inverter including such a connecting structure.

A connecting structure of a refrigerant pipe described in the present specification has the following configuration. The connecting structure includes a housing, a cooler, an inner refrigerant pipe, an outer refrigerant pipe, and a joint pipe. The housing includes a housing wall, and the housing wall has a first through hole. The cooler is placed inside the housing. The inner refrigerant pipe extends from the cooler. The outer refrigerant pipe is placed outside the housing and includes a first flange or a first rib on an outer circumference of the outer refrigerant pipe. The joint pipe includes a second flange or a second rib on an outer circumference of the joint pipe. The joint pipe is attached to the first through hole. The inner refrigerant pipe is fitted to the joint pipe from a housing inner side. The outer refrigerant pipe is fitted to the joint pipe from a housing outer side. A tip of the inner refrigerant pipe and a tip of the outer refrigerant pipe define a gap inside the joint pipe. An end surface of the first flange or the first rib in a refrigerant-pipe axis direction abuts with an end surface of the second flange or the second rib in the refrigerant-pipe axis direction.

According to the connecting structure, since the flange or rib of the outer refrigerant pipe abuts with the flange or rib of the joint pipe in the refrigerant-pipe axis direction, the outer refrigerant pipe is not pushed into the housing. Further, even if the outer refrigerant pipe is pushed to some extent, the tip of the outer refrigerant pipe does not push the inner refrigerant pipe, because the gap is secured between the tip of the outer refrigerant pipe and the tip of the inner refrigerant pipe. Thus, according the connecting structure, even if a vehicle has a collision and an impact toward a housing inner side is added to the outer refrigerant pipe, it is possible to prevent such a problem that the outer refrigerant pipe is pushed to damage the cooler inside the housing.

The joint pipe may have a step inside the joint pipe, and an inside diameter of the joint pipe on the housing outer side relative to the step may be larger than an inside diameter of the joint pipe on the housing inner side relative to the step. A tip of the inner refrigerant pipe may be fitted so that the tip is placed on the housing inner side relative to the step. According to such a configuration, the outer refrigerant pipe cannot move toward the housing inner side beyond the step, so that the tip of the outer refrigerant pipe does not push the inner refrigerant pipe.

Further, in a case where the joint pipe has an inside diameter difference with respect to the step, an inside diameter of the outer refrigerant pipe fitted to the joint pipe may be larger than an outside diameter of a tip of the inner refrigerant pipe. Even if the inner refrigerant pipe moves toward the outer refrigerant pipe due to an impact of a collision, the inner refrigerant pipe can move inside the outer refrigerant pipe, so that the inner refrigerant pipe does not collide with the outer refrigerant pipe.

An inverter described in the present specification has the following configuration. An inverter for a vehicle comprises a connecting structure. The connecting structure includes a housing, a cooler, an inner refrigerant pipe, an outer refrigerant pipe, and a joint pipe. The housing includes a housing wall, and the housing wall has a first through hole. The cooler is placed inside the housing. The inner refrigerant pipe is extending from the cooler. The outer refrigerant pipe is placed outside the housing, and the outer refrigerant pipe includes a first flange or a first rib on an outer circumference of the outer refrigerant pipe. The joint pipe includes a second flange or a second rib on an outer circumference of the joint pipe. The joint pipe is attached to the first through hole. The inner refrigerant pipe is fitted to the joint pipe from a housing inner side. The outer refrigerant pipe is fitted to the joint pipe from a housing outer side. A tip of the inner refrigerant pipe and a tip of the outer refrigerant pipe defining a gap inside the joint pipe. An end surface of the first flange or the first rib in a refrigerant-pipe axis direction abuts with an end surface of the second flange or the second rib in the refrigerant-pipe axis direction. The cooler is a laminated cooling unit. The laminated cooling unit is configured such that a plurality of power cards is laminated alternately with a plurality of cooling plates. The power card houses a semiconductor element therein. The plurality of cooling plates is connected to each other via a connecting pipe. The inner refrigerant pipe is fitted to the joint pipe from inside the, housing. The inner refrigerant pipe extends from the cooling plates along a laminating direction of the laminated cooling unit.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
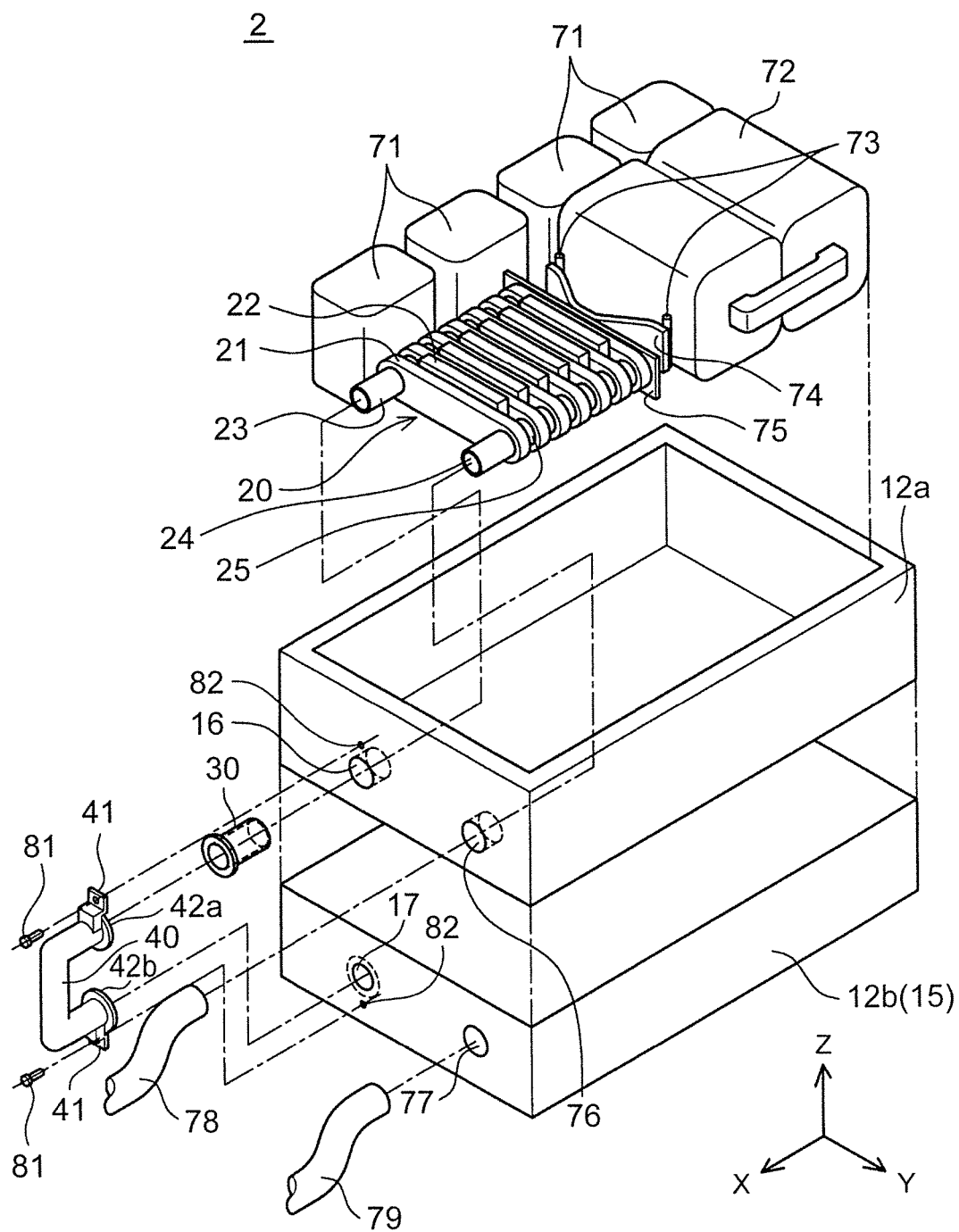
FIG. 1 is an exploded perspective view of an inverter of an embodiment.

An inverter of the present embodiment includes a laminated cooling unit (a first cooler). The laminated cooling unit is configured such that a plurality of power cards housing a semiconductor element therein are laminated alternately with a plurality of cooling plates, and adjacent cooling plates across a power card is connected to each other via a connecting pipe. A refrigerant pipe extending from the cooling plates along a laminating direction of the laminated cooling unit is fitted to a joint pipe from inside a housing. In such an inverter, two different coolers (the first cooler and a second cooler) are provided in the inverter, and the coolers may be connected to each other via a refrigerant pipe (an example of an outer refrigerant pipe) passing outside the housing of the inverter. That is, such a configuration may be employed that the housing of the inverter has two through holes, arid both ends of the outer refrigerant pipe are connected to respective through holes.

In a case where two through holes are provided on the same wall surface of the housing of the inverter, it is necessary to devise a seal structure between each of the ends of the outer refrigerant pipe and each of the through holes. There are two types as the seal structure. One of them is a structure in which a sealer is placed around an opening of a through hole, and is called a face seal. Typically, a planar or ring-shaped sealing member is placed on a surface around the opening, and a flange provided in an end of a refrigerant pipe is connected to the through hole with the sealing member sandwiched therebetween. The other one of them is a structure in which a tubular or ring-shaped sealer is placed between an inner peripheral surface of a hole continuous with an opening of a through hole and an outer peripheral surface of a refrigerant pipe, and is called a shaft seal. In this case, an end of the refrigerant pipe is inserted in the through hole. In the present specification, placing a face seal member in a connection portion between a through hole and a pipe (or between a pipe and a pipe) is referred to as "being connected via a face seal," and placing a shaft seal member in a connection portion between a through hole and a pipe (or between a pipe and a pipe) is referred to as "being connected via a shaft seal."

In a case where a through hole is connected to a pipe via the face seal, even if the pipe moves to some extent in a plane (an opening surface) including an opening of the through hole, sealing by the sealing member is maintained. That is, in a case of the face seal, it is possible to ensure a margin that allows an end of the refrigerant pipe to move in the opening surface, while maintaining the sealing. On the other hand, in a case where a through hole is connected to a pipe via the shaft seal, even if the pipe moves to some extent in an axis direction of the shaft seal (an axis direction of the through hole), sealing by the sealing member is maintained. That is, in a case of the shaft seal, it is possible to ensure a margin that allows an end of the refrigerant pipe to move in a direction perpendicular to an opening surface (in the axis direction of the through hole), while maintaining the sealing. Accordingly, if one end of an outer refrigerant pipe is connected via the face seal and the other end thereof is connected via the shaft seal, the outer refrigerant pipe, is allowed to move both in an opening surface direction and in a direction perpendicular to the opening surface. In other words, by combining the shaft seal and the face seal, it is possible to ensure a margin in a connection portion between the outer refrigerant pipe and the through hole such that the outer refrigerant pipe can move relative to the through hole three-dimensionally. Here, that "the pipe moves" indicates that the pipe moves by a distance of about a positional error of the opening of the through hole. A technique described in the present specification is based on the above principle.

In the above inverter, both ends of the outer refrigerant pipe are connected to two through holes provided on the same housing wall. One end of the outer refrigerant pipe is connected to the through hole of the housing via the above joint pipe. The joint pipe is connected to the through hole with a face seal being sandwiched between the joint pipe and a surface of the housing. The one end of the outer refrigerant tube is connected to the joint pipe via a shaft seal. The other end of the outer refrigerant tube is connected to the other through hole via a face seal.

The seal structure facilitates a connection operation of the outer refrigerant pipe. That is, the one end of the outer refrigerant pipe is fitted to the joint pipe. Since the outer refrigerant pipe is connected to the joint pipe via the shaft seal, the outer refrigerant pipe has clearance in an axis direction of the refrigerant pipe. Further, the other end of the outer refrigerant pipe can rotate around an axis of the refrigerant pipe. That is, the other end of the outer refrigerant pipe of which the one end is connected to the joint pipe has clearance both in an opening-surface direction of the other through hole and an axis direction thereof. Hence, alignment with the opening of the other through hole is easily performed. Further, since the outer refrigerant pipe has clearance both in the opening-surface direction and in an outer surface direction with respect to the through hole, even if a relative position of the two through holes deviates from a design value to some extent, the outer refrigerant pipe can be connected easily.

Figure 2:
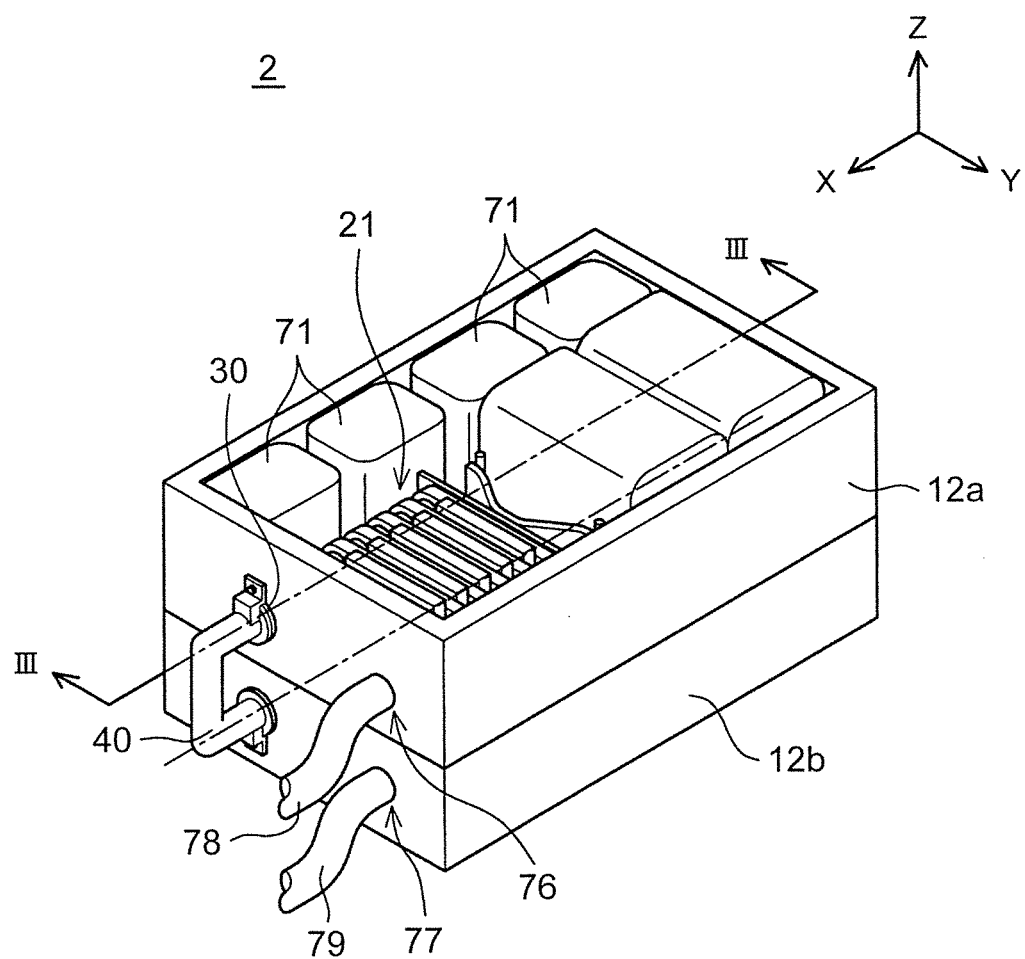
FIG. 2 is a perspective view of the inverter (a state where a cover is taken off)
Figure 3:
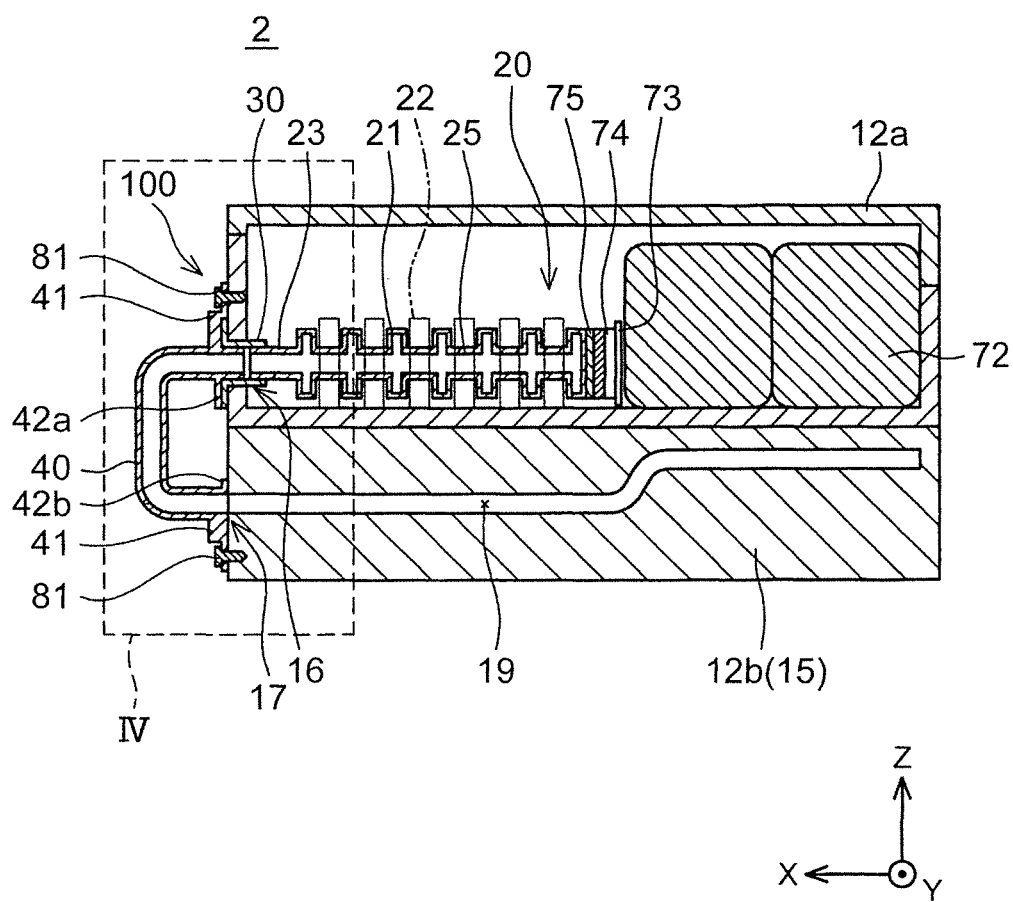
FIG. 3 is a sectional view taken along an arrow in FIG. 2.

The following describes a connecting structure and an inverter according to an embodiment, with reference to the drawings. FIG. 1 is an exploded perspective view of an inverter 2, and FIG. 2 is a perspective view of the inverter 2. Note that a cover of the inverter is not illustrated to assist understanding. Further, FIG. 3 is a sectional view taken along an arrow in FIG. 2 (a sectional view crossing an outer refrigerant pipe 40 lengthwise). The inverter 2 is provided in an electric vehicle, and configured such that, after boosting up a direct-current power of a battery, the inverter 2 converts the direct-current power into an alternating current, and then supplies it to a drive motor. The inverter 2 is formed in combination of a voltage converter circuit and an inverter circuit in terms of an electric circuit. In terms of hardware, the inverter 2 is mainly constituted by: a laminated cooling unit (the first cooler) 20 including, in an integrated manner, a switching element (a transistor such as IGBT) and a diode connected in reverse-parallel to the transistor and configured to cool off the switching element and the diode; a smoothing capacitor 71 for smoothing a heavy-current for motor drive; a reactor 72 used for the voltage converter circuit; a second cooler 15 for cooling off the reactor 72 and the smoothing capacitor 71; and a circuit substrate including a control circuit for controlling the switching element. Note that the circuit substrate is disposed above the laminated cooling unit 20 and the reactor 72, but is not illustrated herein. Further, FIG. 2 illustrates a state where a cover is taken off, so as to make it easy to understand a layout inside a housing of the inverter.

In FIG. 1, a housing 12 of the inverter 2 is divided into two housings, i.e., a housing 12a and a housing 12b. The housing 12a houses therein the reactor 72, the laminated cooling unit 20, and so on, and the housing 12b is the second cooler 15 itself. The housing 12b is combined with the housing 12a to constitute one housing 12.

The inverter 2 includes two types of coolers (the first cooler and the second cooler). One of the coolers is the second cooler 15 for cooling off the reactor 72 and the capacitor 71, and the other one is the laminated cooling unit 20. The laminated cooling unit (the first cooler) 20 is configured such that a plurality of power cards 22 each formed by molding a switching element therein, and a plurality of plate-shaped cooling plates 21 in each of which refrigerant flows are laminated alternately. An inside of the cooling plate 21 is hollow, and through holes are provided on both sides of the cooling plate 21 (that is, both sides of the power card 22) in its longitudinal direction. The through holes of the cooling plates 21 adjacent to each other are connected to each other via a connecting pipe 25. Further, two tubes 23 and 24 are connected to the cooling plate 21 provided in an end of the laminated cooling unit 20. The laminated cooling unit 20 is housed in the housing 12a, and the tubes 23, 24 are connected to through holes 16, 76 provided on a side wall (a housing wall) of the housing 12a. Refrigerant is supplied to the laminated cooling unit 20 via one through hole 76, and the refrigerant is discharged from the other through hole 16. A supply pipe 78 for supplying the refrigerant is connected to the one through hole 76 from outside the housing, and one tube 24 is connected thereto inside the housing. The other tube 23 is connected to the other through hole 16 inside the housing, and the outer refrigerant pipe 40 is connected thereto via a joint pipe 30 outside the housing. The outer refrigerant pipe 40 is a U-shaped pipe, and the other end (a lower end in FIGS. 1, 2) thereof is connected to a through hole 17 of the housing 12b. Flanges 42a, 42b are provided in both ends of the outer refrigerant pipe 40, and a rib 41 extends from each of the flanges. The outer refrigerant pipe 40 is fixed to the housing 12 via the ribs 41 with bolts 81. A reference sign 82 of FIG. 1 is a bolt hole to which the bolt 81 is fixed.

The refrigerant supplied from outside the inverter 2 via the refrigerant supply pipe 78 is supplied to the laminated cooling unit 20 via the through hole 76 and the one tube 24. The refrigerant flowing from the tube 24 is distributed to all the cooling plates 21 via one connecting pipe 25 connected to the cooling plates 21. The refrigerant flows inside the cooling plates 21 in a longitudinal direction thereof, so as to cool off the power cards 22 making contact with the cooling plates 21. The refrigerant that absorbs heat of the power cards 22 passes through the other connecting pipe 25 connected to the cooling plates 21, and is discharged from the housing 12a via the tube 23 and the through hole 16. After that, the refrigerant is led to the housing 12b (that is, the second cooler 15) via the joint pipe 30 and the outer refrigerant pipe 40. Inside the second cooler 15, a passage 19 (see FIG. 3) for the refrigerant is provided at a position right under the reactor 72 and the capacitor 71 provided in the housing 12a. While the refrigerant passes through the passage 19, the reactor 72 and the capacitor 71 are cooled off. Eventually, the refrigerant is discharged from a refrigerant discharge pipe 79 connected to the other through hole 77 provided in the housing. Note that a cooling system including a radiator for cooling off the refrigerant and a pump for circulating the refrigerant is provided outside the inverter 2, and the refrigerant that has cooled off the inverter 2 is cooled down by the radiator, and then sent to the inverter 2 again. The laminated cooling unit 20 and the second cooler 15 use liquid refrigerant. The refrigerant is typically water or LLC (Long Life Coolant).

The laminated cooling unit 20 is configured such that an insulating plate 75 and a leaf spring 74 are further laminated on one end of a laminated body thereof, and are sandwiched and supported by an inner wall of the housing 12 and support pillars 73. Due to the leaf spring 74, the laminated cooling unit 20 is supported by the housing 12, while a load is added thereto in a laminating direction thereof. Due to the load of the leaf spring 74, the cooling plates 21 and the power cards 22 laminated alternately make close contact with each other, so that heat is transmitted well therebetween.

The inverter 2 is provided with four through holes 16, 76, 17, 77 on its housing wall. The through hole 16 and the through hole 17 are connected to each other via the outer refrigerant pipe 40. One end of the outer refrigerant pipe 40 is connected to the through hole 16 via the joint pipe 30. Note that respective seal members are provided in a connection portion between the joint pipe 30 and the through hole 16, in a connection portion between the joint pipe 30 and the tube 23, in a connection portion between the joint pipe 30 and the outer refrigerant pipe 40, and in a connection portion between the outer refrigerant pipe 40 and the through hole 17. However, in FIGS. 1 to 3, the sealing members are not illustrated. The sealing members will be described with reference to FIG. 4.

Figure 4:
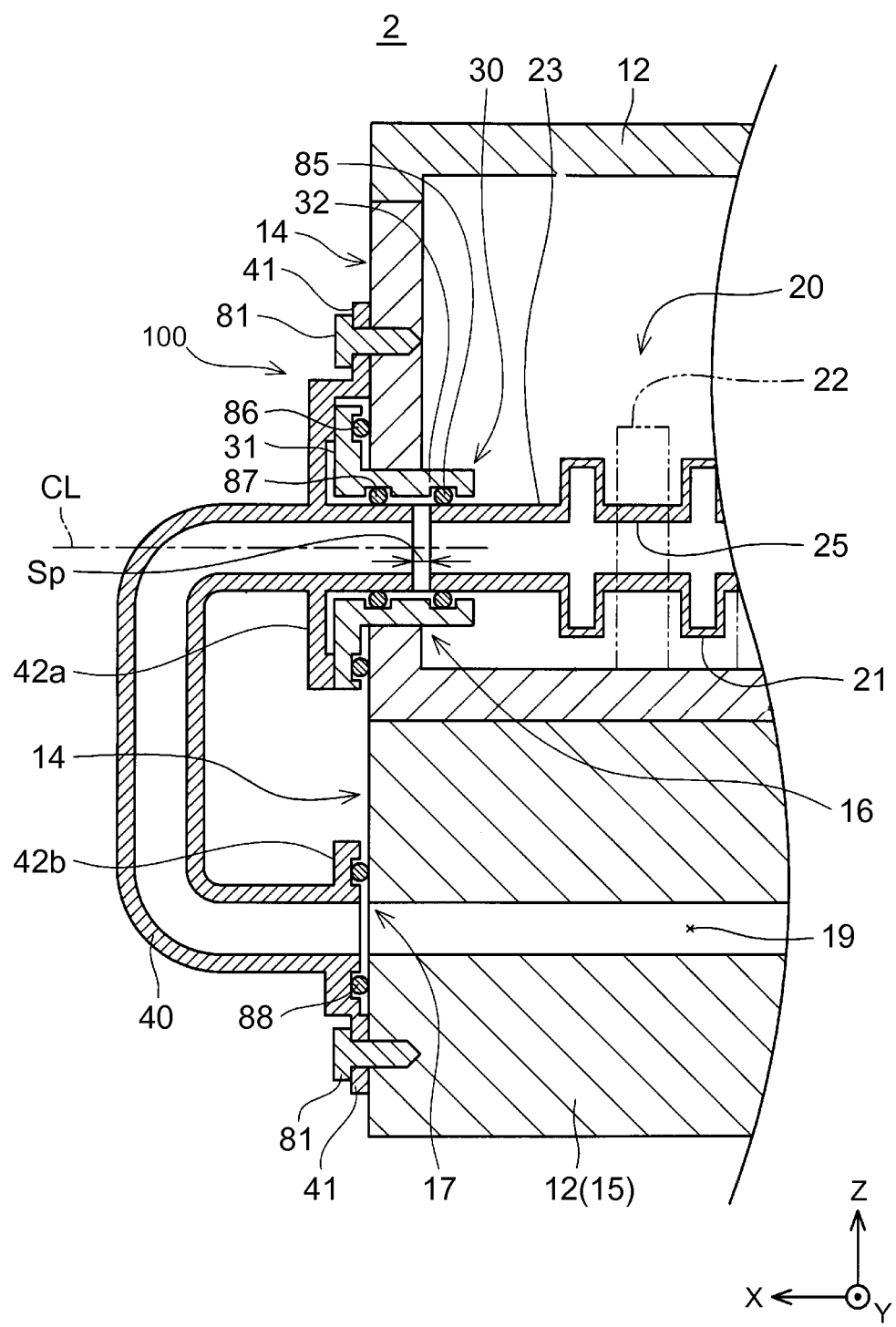
FIG. 4 is an expanded sectional view of a part shown by a broken line IV in FIG. 3.

Referring now to FIG. 4, the following describes a connecting structure 100 of the outer refrigerant pipe 40 connected to the through hole 16 via the joint pipe 30. Further, the following describes a connecting structure between the other end of the outer refrigerant pipe 40 and the through hole 17. FIG. 4 is a view illustrating, in a magnified manner, a range indicated by a broken line IV in a sectional view of FIG. 3. In other words, FIG. 4 is a sectional view in a plane including respective center lines of the through holes 16, 17. Note that, in FIG. 4, the power card 22 is illustrated by a virtual line.

The joint pipe 30 is fitted to the through hole 16 of the housing 12 of the inverter. The joint pipe 30 is constituted by a tubular portion 32 inserted into the through hole 16, and a flange 31 provided in one end portion (a left end in FIG. 4) of the tubular portion 32. The flange 31 abuts with a peripheral part of the through hole 16 on a surface of a housing wall 14. A groove is provided on that surface of the flange 31 which faces the housing wall 14, so as to go around the tubular portion 32 to surround the tubular portion 32, and an O-ring 86 is fitted into the groove. When the joint pipe 30 is inserted into the through hole 16, the O-ring 86 is placed between the flange 31 and the housing wall 14, so as to seal therebetween. That is, the joint pipe 30 is connected to the through hole 16 via a face seal.

The tube 23 of the laminated cooling unit 20 is fitted inside the tubular portion 32 of the joint pipe 30, from inside the housing. A groove is provided inside the tubular portion 32 so as to go around the tubular portion 32 in its circumferential direction, and an O-ring 85 is fitted into the groove. When the tube 23 is inserted into the tubular portion 32, the O-ring 85 is placed between an inner peripheral surface of the tubular portion 32 and an outer peripheral surface of the tube 23, so as to seal therebetween. That is, the joint pipe 30 is connected to the tube 23 of the laminated cooling unit 20 via a shaft seal.

The outer refrigerant pipe 40 is fitted inside the tubular portion 32 of the joint pipe 30 from outside the housing. Another groove is provided inside the tubular portion 32 so as to go around an inner surface of the tubular portion 32 in the circumferential direction, and an O-ring 87 is fitted into the groove. When one end of the outer refrigerant pipe 40 is inserted into the tubular portion 32, the O-ring 87 is placed between the inner peripheral surface of the tubular portion 32 and an outer peripheral surface of the outer refrigerant pipe 40, so as to seal therebetween. That is, the joint pipe 30 is connected to one end of the outer refrigerant pipe 40 via a shaft seal.

The tube 23 is fitted to the tubular portion 32 of the joint pipe 30 from inside the housing, and the outer refrigerant pipe 40 is fitted thereto from outside the housing. As illustrated in FIG. 4, a gap Sp is secured along an axis CL between a tip of the tube 23 and a tip of the outer refrigerant pipe 40.

The flange 42a is provided in an outer circumference of the outer refrigerant pipe 40. An end surface of the flange 42a in a direction of a refrigerant pipe axis CL makes surface contact with an end surface of the flange 31 of the joint pipe 30 in the direction of the axis CL. Further, the rib 41 extends from the flange 42a. One end of the outer refrigerant pipe 40 is fixed to the housing 12 via the rib 41 with the bolt 81.

The other end of the outer refrigerant pipe 40 is connected to the through hole 17 of the housing 12 (the second cooler 15). The flange 42b is provided in the other end of the outer refrigerant pipe 40, and the flange 42b abuts with a peripheral part of an opening of the through hole 17, on the surface of the housing wall 14 of the housing 12. A groove is provided on that end surface of the flange 42b which faces the housing wall 14 so as to go around the peripheral part of the opening of the through hole 17, and an O-ring 88 is fitted into the groove. When the outer refrigerant pipe 40 is connected to the through hole 17, the O-ring 88 is placed between the flange 42b and the surface of the peripheral part of the opening of through hole 17, so as to seal therebetween. That is, the other end of the outer refrigerant pipe 40 is connected to the through hole 17 via a face seal. Note that the rib 41 also extends from the flange 42b, and the other end of the outer refrigerant pipe 40 is fixed to the housing wall 14 via the rib 41 with the bolt 81.

The joint pipe 30 and the outer refrigerant pipe 40 are made from a rigid body. Typically, the joint pipe 30 and the outer refrigerant pipe 40 are made from resin or metal such as aluminum. Further, the O-rings 85, 86, 87, 88 are made from rubber or silicon, for example. Further, the joint pipe 30 including the tubular portion 32 and the flange 31 provided on one end thereof corresponds to a bush of a so-called straight pipe.

As illustrated in FIG. 4, the flange 42a is provided around the one end of the outer refrigerant pipe 40, and the flange 42a makes surface contact with the flange 31 of the joint pipe 30 in the direction of the axis CL. An opposite surface of the flange 31 makes contacts with the housing wall 14. The tip of the outer refrigerant pipe 40 is fitted to the tubular portion 32 of the joint pipe 30. However, even if the outer refrigerant pipe 40 receives an impact in the direction of the axis CL at the time of a collision, the outer refrigerant pipe 40 is not pushed into the housing 12, because the flanges makes surface contact with each other. That is, at the time of a collision, even if the outer refrigerant pipe 40 receives an impact in a direction toward the housing, such a problem does not occur that the outer refrigerant pipe 40 is pushed into the housing and damages the laminated cooling unit 20.

Further, even if the tip of the outer refrigerant pipe 40 slightly moves toward inside the housing, the tip of the outer refrigerant pipe 40 does not abut with the tube 23, because the gap Sp is secured between the tip of the outer refrigerant pipe 40 and the tip of the tube 23. That is, such a problem does not occur that the outer refrigerant pipe 40 pushes the tube 23 to damage the laminated cooling unit 20.

Further, the one end (an upper end in FIG. 4) of the outer refrigerant pipe 40 is connected to the joint pipe 30 via a shaft seal, and the other end (a lower end in FIG. 4) thereof is connected to the housing 12 via a face seal. The structure facilitates a connection operation of the outer refrigerant pipe 40. That is, the one end of the outer refrigerant pipe 40 is fitted to the joint pipe 30. Since the outer refrigerant pipe 40 is connected to the joint pipe 30 via a shaft seal, the outer refrigerant pipe 40 has clearance in the direction of the axis CL. Further, the other end of the outer refrigerant pipe 40 can rotate around the axis CL. That is, the other end of the outer refrigerant pipe 40 of which the one end is connected to the joint pipe 30 has clearance both in an opening-surface direction of the through hole 17 and in the axis direction thereof, so that alignment with the opening of the through hole 17 is easily performed. Further, this means that if a relative position between the opening of the through hole 16 and the opening of the through hole 17 slightly deviates from a designed value, the outer refrigerant pipe 40 can be connected. Note that the clearance means an allowable positional error at the time when the outer refrigerant pipe 40 is assembled.

Figure 5:
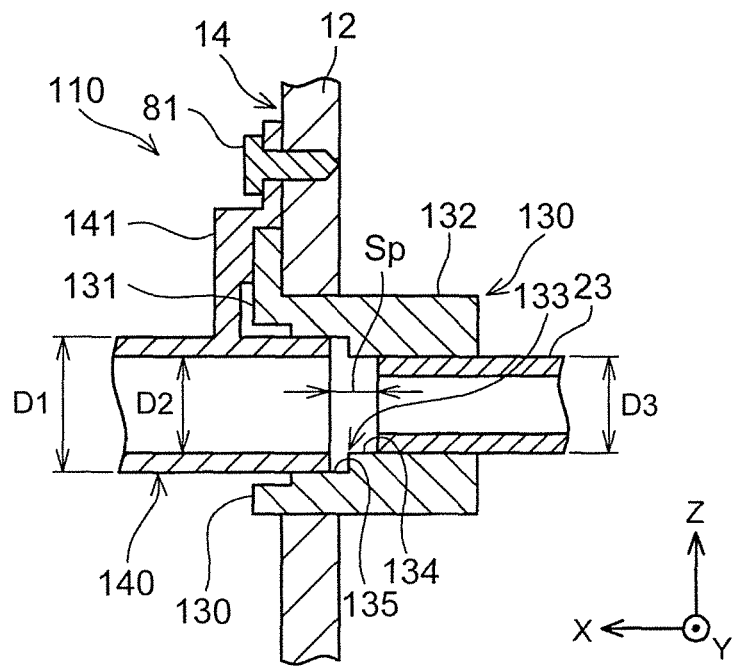
FIG. 5 is a sectional view to describe a first modification of a connecting structure.

Referring now to FIG. 5, the following describes a connecting structure 110 of a modification. Note that FIG. 5 corresponds to an enlarged sectional view around an upper end of the outer refrigerant pipe 40 in FIG. 4. Further, for simplification of the view, the O-rings 85, 86, 87 illustrated in FIG. 4 and the grooves where the O-rings are placed are not illustrated. Further, the laminated cooling unit 20 to which the tube 23 is connected is also not illustrated herein.

An inner peripheral surface of a joint pipe 130 (a tubular portion 132) is provided with a step 133. An inside diameter D1 on a housing outer side relative to the step 133 (on the left side in the figure) is larger than an inside diameter D3 on a housing inner side relative to the step 133 (on the right side in the figure). An outer refrigerant pipe 140 is fitted to a large diameter portion 135, and a tube 23 is fitted to a small diameter portion 134. The inside diameter D1 corresponds to an outside diameter of the outer refrigerant pipe 140, and the inside diameter D3 corresponds to an outside diameter of the tube 23. A tip of the tube 23 is placed on the housing inner side (the small diameter portion 134) relative to the step 133. According to this structure, since a tip of the outer refrigerant pipe 140 does not move toward the housing inner side beyond the step 133 inside the joint pipe 130, the outer refrigerant pipe 140 does not push the tube 23. That is, the outer refrigerant pipe 140 does not damage a laminated cooling unit inside the housing.

Further, an inside diameter D2 of the outer refrigerant pipe 140 is larger than the outside diameter D3 of the tube 23. Accordingly, even if the tube 23 moves toward the housing outer side due to an impact of a collision, the tube 23 moves inside the outer refrigerant pipe 140, so that the tube 23 does not collide with the outer refrigerant pipe 140.

The outer refrigerant pipe 140 includes a rib 141 on its outer circumference, instead of a flange. Further, the joint pipe 130 also includes a rib 131 on its outer circumference, instead of a flange. The outer refrigerant pipe 140 is fixed to a housing 12 via the rib 141 with a bolt 81. The rib 141 abuts with the rib 131 of the joint pipe 130 in an axis direction of the refrigerant pipe. An opposite side of the rib 131 abuts with a housing wall 14. Even if the outer refrigerant pipe 140 receives an impact in a direction toward the housing inner side, the rib 141 and the rib 131 prevent the outer refrigerant pipe 140 from being pushed into the housing.

Figure 6:
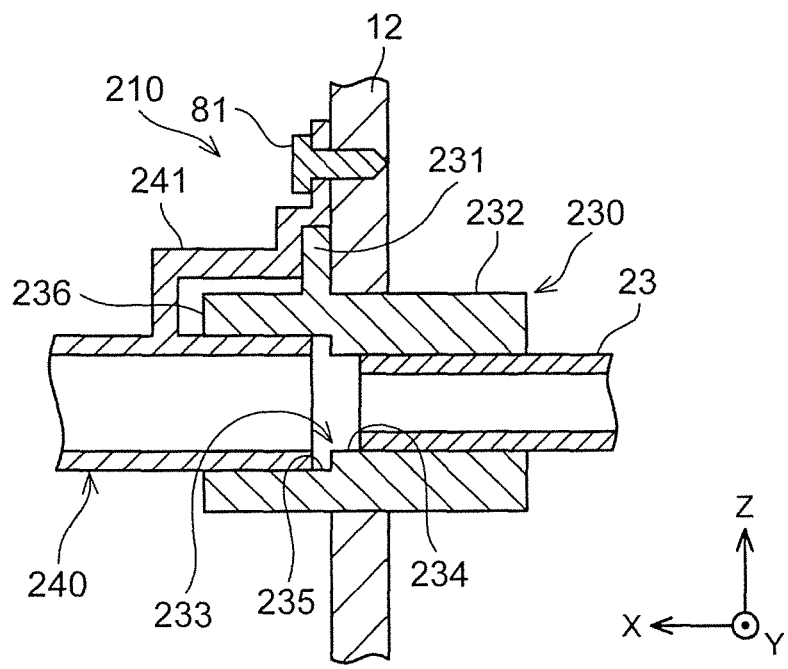
FIG. 6 is a sectional view to describe a second modification of the connecting structure.

Referring now to FIG. 6, the following describes a connecting structure 210 of a second modification. A joint pipe 230 includes a rib 231, instead of a flange. Further, the joint pipe 230 includes a first tubular portion 232 on a housing inner side relative to the rib 231 (on the right side in the figure), and includes a second tubular portion 236 on a housing outer side relative to the rib 231 (on the left side in the figure). A step 233 is provided on an inner peripheral surface of the joint pipe 230, a tip of an outer refrigerant pipe 240 is fitted to a large diameter portion 235 on a left side relative to the step 233, and a tube 23 is fitted to a small diameter portion 234 on the right side relative to the step 233. Note that, similarly to the first modification, an inside diameter of the large diameter portion 235 is larger than an inside diameter of the small diameter portion 234.

The outer refrigerant pipe 240 includes a rib 241 on its outer circumference, and the outer refrigerant pipe 240 is fixed to a housing 12 via the rib 241 with a bolt 81. The rib 241 of the outer refrigerant pipe 240 abuts with the rib 231 of the joint pipe 230. The connecting structure 210 of the second modification of FIG. 6 yields the same effect as the connecting structure 110 of the first modification.

Figure 7:
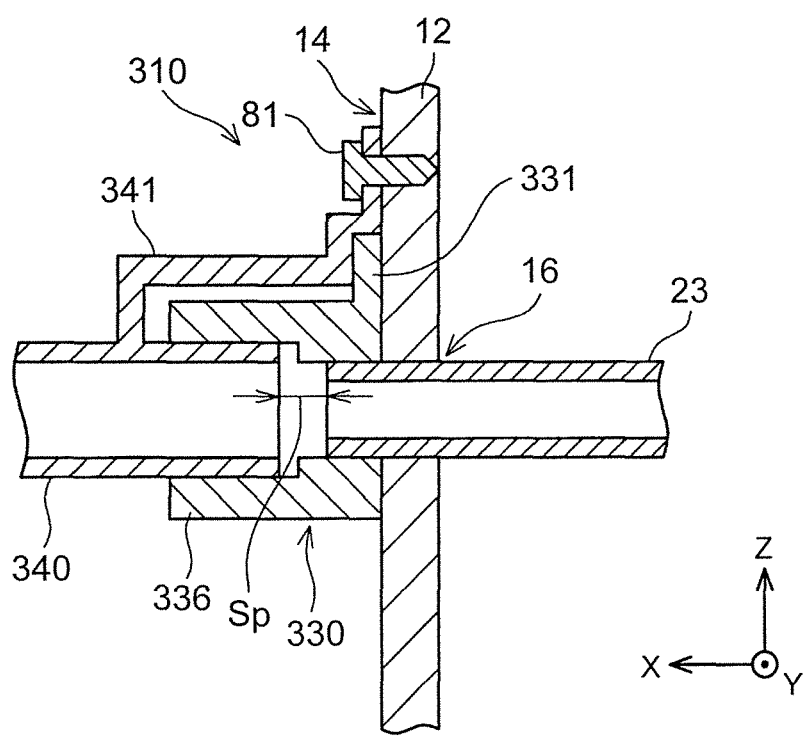
FIG. 7 is a sectional view to describe a third modification of the connecting structure.

Referring now to FIG. 7, the following describes a connecting structure 310 of a third modification. A joint pipe 330 includes a tubular portion 336 and a rib 331. The rib 331 is provided in a housing-side end of the tubular portion 336. That is, the joint pipe 330 is not fitted to a through hole 16 of a housing 12, but is attached to an opening of the through hole 16. An outer refrigerant pipe 340 is fitted to the tubular portion 336 of the joint pipe 330 from a housing outer side, and a tube 23 is fitted thereto from a housing inner side. A gap Sp is secured between a tip of the outer refrigerant pipe 340 and a tip of the tube 23. Although a reference sign is omitted, a step is provided on an inner side of the joint pipe 330, the outer refrigerant pipe 340 is fitted to a large diameter portion on the housing outer side relative to the step, and the tube 23 is fitted to a small diameter portion on the housing inner side relative to the step.

One surface of the rib 331 of the joint pipe 330 in a refrigerant axis direction abuts with a rib 341 extending from an outer circumference of the outer refrigerant pipe 340, and the other surface of the rib 331 abuts with a housing wall 14. In the connecting structure 310, the joint pipe 330 is not fitted to the through hole 16 of the housing, but the same effect as the second modification is yielded.

The following describes a point to keep in mind in regard to the technique described in the above embodiment. Either a flange or a rib should be provided on the outer circumference of the outer refrigerant pipe. The flange or rib abuts with a flange (or a rib) of the joint pipe, and an opposite side of the flange (or the rib) of the joint pipe abuts with the housing wall. The abutment structure prevents the outer refrigerant pipe from further moving into the housing.

In the inverter 2 of the embodiment, the O-ring is used for sealing between the through hole and each of the joint pipe 30 and the outer refrigerant pipe 40. A planar sealing member may be used for the face seal instead of the O-ring. A tubular sealing member may be used for the shaft seal instead of the O-ring. The tube 23 of the laminated cooling unit 20 corresponds to an example of an inner refrigerant pipe.

The concrete embodiments of the invention have been described in detail, but these embodiments are only examples and do not limit the invention according to Claims. A technique according to Claims includes embodiments obtained by variously modifying or altering the concrete embodiments exemplified as above. Technical elements described in the present specification or the drawings exhibit a technical usability solely or in various combinations, and are not limited to combinations as described in Claims as of filing the present application. Further, the technique exemplified in the present specification or the drawings can achieve a plurality of objects at the same time, and has a technical usability by achieving one of those objects.

What is claimed is:
1. A connecting structure for a refrigerant pipe, the connecting structure comprising:
   a housing including a housing wall, the housing wall having a first through hole;
   a cooler placed inside the housing;
   an inner refrigerant pipe extending from the cooler;
   an outer refrigerant pipe placed outside the housing, the outer refrigerant pipe including a first flange or a first rib on an outer circumference of the outer refrigerant pipe; and
a joint pipe including a second flange or a second rib on an outer circumference of the joint pipe, the joint pipe being attached to the first through hole, the inner refrigerant pipe being fitted to the joint pipe from a housing inner side, the outer refrigerant pipe being fitted to the joint pipe from a housing outer side, a tip of the inner refrigerant pipe and a tip of the outer refrigerant pipe defining a gap inside the joint pipe, an end surface of the first flange or the first rib in an refrigerant-pipe axis direction abutting with an end surface of the second flange or the second rib in the refrigerant-pipe axis direction.

2. The connecting structure according to claim 1, wherein the second flange or the second rib abuts with a surface of the housing wall around the first through hole.

3. The connecting structure according to claim 1, wherein the joint pipe has a step inside the joint pipe, an inside diameter of the joint pipe on the housing outer side relative to the step is larger than an inside diameter of the joint pipe on the housing inner side relative to the step, and the tip of the inner refrigerant pipe is placed on the housing inner side relative to the step.

4. The connecting structure according to claim 3, wherein an inside diameter of the outer refrigerant pipe is larger than an outside diameter of the inner refrigerant pipe.

5. The connecting structure according to claim 1, wherein a tubular portion of the joint pipe is fitted to the first through hole, the tubular portion extends toward the housing inner side from the second flange or the second rib.

6. An inverter for a vehicle, the inverter comprising:
a connecting structure including:
   a housing including a housing wall, the housing wall having a first through hole;
   a cooler placed inside the housing;
   an inner refrigerant pipe extending from the cooler; and
   an outer refrigerant pipe placed outside the housing, the outer refrigerant pipe including a first flange or a first rib on an outer circumference of the outer refrigerant pipe; and
   a joint pipe including a second flange or a second rib on an outer circumference of the joint pipe, the joint pipe being attached to the first through hole, the inner refrigerant pipe being fitted to the joint pipe from a housing inner side, the outer refrigerant pipe being fitted to the joint pipe from a housing outer side, a tip of the inner refrigerant pipe and a tip of the outer refrigerant pipe defining a gap inside the joint pipe, an end surface of the first flange or the first rib in an refrigerant-pipe axis direction abutting with an end surface of the second flange or the second rib in the refrigerant-pipe axis direction, wherein the cooler is a laminated cooling unit, the laminated cooling unit is configured such that a plurality of power cards housing a semiconductor element is laminated alternately with a plurality of cooling plates, the plurality of cooling plates is connected to each other via a connecting pipe, the inner refrigerant pipe is fitted to the joint pipe from inside the housing, the inner refrigerant pipe extends from the cooling plates along a laminating direction of the laminated cooling unit.

7. The inverter according to claim 6, wherein
the housing wall has a second through hole,
the outer refrigerant pipe connects the first through hole to the second through hole, the joint pipe is connected to the first through hole with a first face seal being sandwiched between the joint pipe and a surface of the housing wall, one end of the outer refrigerant pipe is fitted to the joint pipe with a shaft seal being sandwiched between the outer refrigerant pipe and the joint pipe, and the other end of the outer refrigerant pipe is connected to the second through hole with a second face seal being sandwiched between the other end of the outer refrigerant pipe and the surface of the housing wall.

* * * * *